(12) United States Patent
Balizer

(10) Patent No.: US 6,847,153 B1
(45) Date of Patent: Jan. 25, 2005

(54) POLYURETHANE ELECTROSTRICTION

(75) Inventor: Edward Balizer, Bethesda, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 179 days.

(21) Appl. No.: 10/161,991

(22) Filed: May 30, 2002

Related U.S. Application Data

(60) Provisional application No. 60/297,716, filed on Jun. 13, 2001.

(51) Int. Cl.[7] .............................................. H01L 41/08
(52) U.S. Cl. ...................... 310/311; 310/800; 252/62.9
(58) Field of Search ............................... 310/311, 357, 310/358, 359; 252/62.9

(56) References Cited

U.S. PATENT DOCUMENTS

| | | |
|---|---|---|
| 4,011,818 A | 3/1977 | Stosz, Jr. et al. |
| 4,549,107 A | 10/1985 | Kaneko et al. |
| 4,576,882 A | 3/1986 | Davis et al. |
| 4,654,279 A | 3/1987 | Bauer et al. |
| 4,707,294 A | 11/1987 | Mathew et al. |
| 4,712,037 A | 12/1987 | Verbeek et al. |
| 4,795,935 A | 1/1989 | Fujii et al. |
| 4,833,659 A | 5/1989 | Geil et al. |
| 4,877,988 A | 10/1989 | McGinniss et al. |
| 5,166,573 A | 11/1992 | Brown |
| 5,229,979 A | 7/1993 | Scheinbeim et al. |
| 5,340,510 A | 8/1994 | Bowen |
| 5,343,443 A | 8/1994 | Merewether |
| 5,977,685 A * | 11/1999 | Kurita et al. ................ 310/311 |
| 6,602,333 B2 * | 8/2003 | Miyabayashi ............ 106/31.27 |

OTHER PUBLICATIONS

Francis M. Guillot, A Thesis presented to the Academic Faculty of Georgia Institute of Technology, dated Aug. 2000.
Francis M. Guillot, Jacek Jarzynaki and Edward Balizer, an article entitled: Measurement of Electrostrictive Coefficients of Polymer Films, on pp. 2980–2990 extracted from a publication of the Acoustical Society of America, dated Dec. 2001.

* cited by examiner

Primary Examiner—Mark Budd
(74) Attorney, Agent, or Firm—Jane Barrow

(57) ABSTRACT

A phase mixed thermoplastic polyurethane elastomer is provided for use in tranducers including underwater transducers, sonars and other electrostriction driven devices. The thermoplastic polyurethane elastomer includes an isocyanate, a butanediol, a polytetramethylene ether glycol, and a polyhydric alcohol. The thermoplastic polyurethane elastomer being made by adding the polytetramethylene ether glycol to isocyanate to form a mixture, then holding said mixture of the polytetramethylene ether glycol and isocyanate to a predetermined temperature for a predetermined time, degassing the mixture and sealing the mixture, measuring the percent free isocyanate to a predetermined molar ratio with the polytetramethylene ether glycol, chain extending the mixture into a first polymer with the butanediol and the polyhydric alcohol, adjusting the stoichiometry of said chain extender to a predetermined isocyanate index to avoid crosslinking, and postcuring the resin of the first polymer for a predetermined time and temperature.

4 Claims, 12 Drawing Sheets

HARD SEGMENT DIOL CHAIN EXTENDERS

SHOWING PENDANT GROUPS 1,4-BDO

HOCH₂CH₂CH₂CH₂OH

DMPD

FIG. 1

HARD SEGMENT DIOL CHAIN EXTENDERS

SHOWING PENDANT GROUPS 1,4-BDO $HOCH_2CH_2CH_2CH_2OH$

DMPD $$HOCH_2\underset{\underset{CH_3}{|}}{\overset{\overset{CH_3}{|}}{C}}CH_2OH$$

Strain Relaxation
Phase Mixed
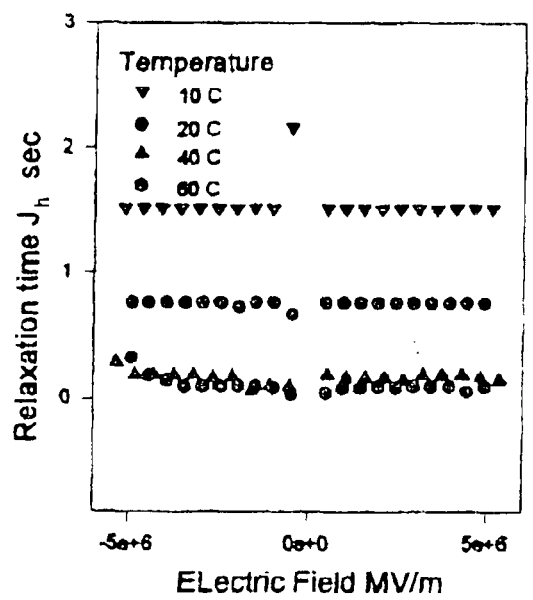
Phase Separated
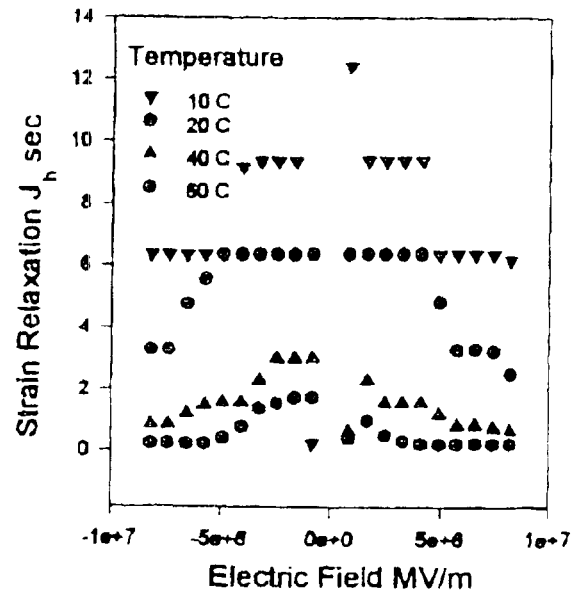
FIG. 3

Electrostriction

FIG. 7
Wide Angle X-ray Scattering
Phase Mixed
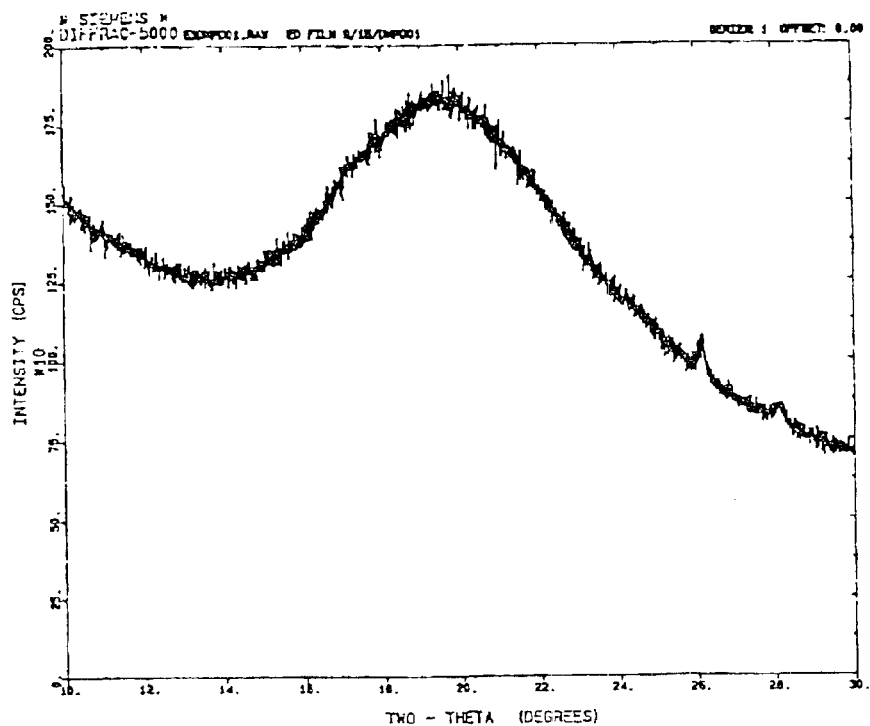
Phase Separated
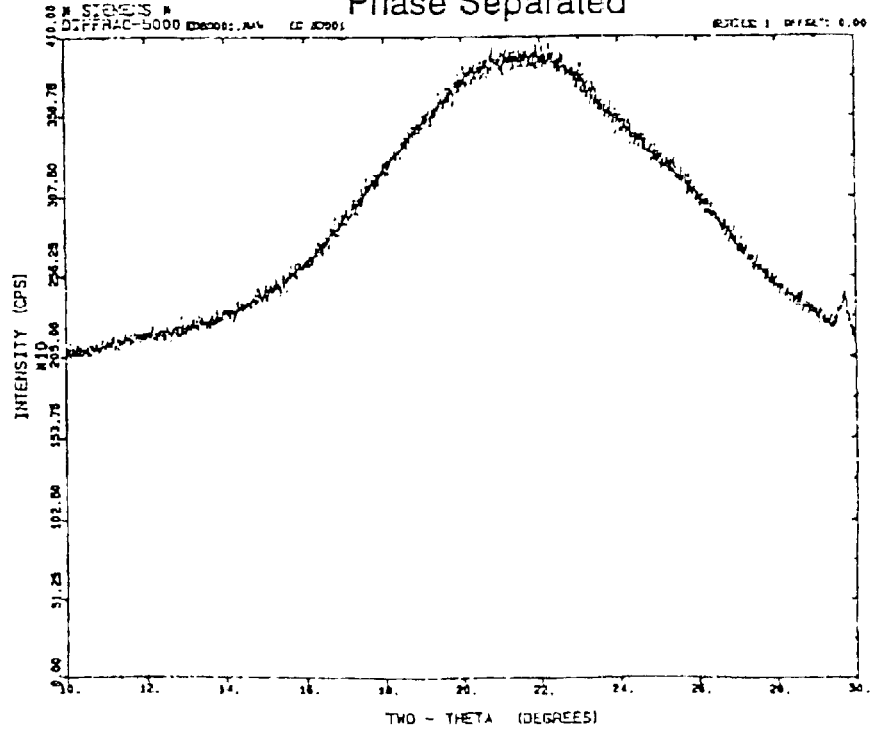

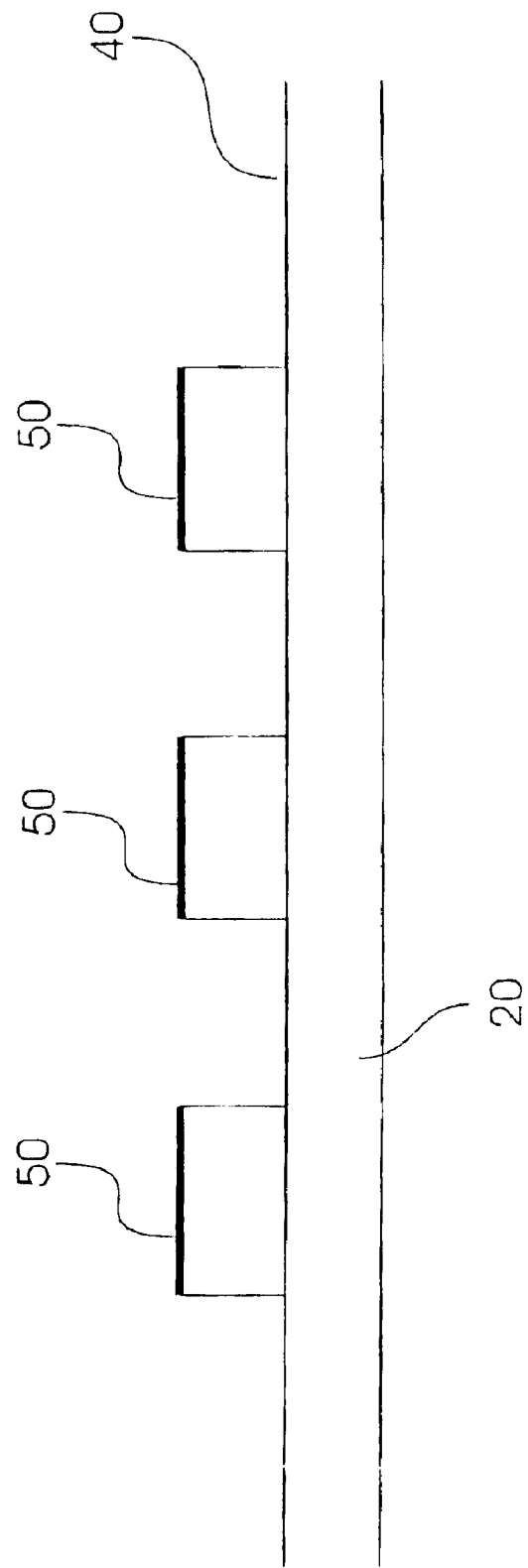

POLYURETHANE ELECTROSTRICTION

CROSS-REFERENCE TO RELATED APPLICATION

This application claims the benefit of U.S. Provisional Application No. 60/297,716 filed 13 Jun. 2001, entitled "Polyurethane Electrostriction", incorporated herein by reference.

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION

1. Field of the Invention

The present invention relates to a polyurethane, and more particularly, to a thermoplastic polyurethane elastomer of a phase mixed system (homogeneous) exhibiting large electrostriction.

2. Description of the Background Art

There has been a strong interest in using electrostrictive polymers in applications such as sonars and transducers. It has recently been shown that the commercial polyurethane (for example under the trademark PELLETHANE by the Dow Chemical Company) thin films show a large electrostriction. The electrostrictive strain is greater than that calculated from Maxwell stresses however the mechanism responsible for this large electriction is not known. Electrostriction is a mechanical or elastic deformation caused by the application of an electric field to any dielectric material.

Polyurethane is a thermoplastic polymer (which can be made thermosetting) produced by the condensation reaction of a polyisocyanate and a hydroxyl-containing material, e.g., a polyol derived from propylene oxide or trichlorobutylene oxide. The basic polymer unit formed as follows:

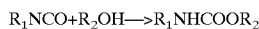

$$R_1NCO + R_2OH \rightarrow R_1NHCOOR_2$$

High performance sonars are needed for use in shallow water for littoral use. These systems require a sonar driver material that demonstrates large strains at low frequencies. Recently, the commercial polymer, a polyurethane, has been shown to have an outstanding electrostrictive strain response two orders of magnitude greater than that of a ceramic or crystal. This large response along with a good impedance match to water indicates that this polyurethane is an excellent transducer material.

The chemical structure of the polyurethane molecule is a sequence of polar hard segment attached to a nonpolar hydrocarbon soft segment. The films of these polymers possess a morphology in which the highly polar hard segments separate and form regions embedded in a low polarity matrix of the soft segment. It has been postulated that the phase separation of the polar hard region was necessary for the large electrostriction to occur. One such mechanism was that the hard segments rotate due to the applied electric field and roll up the soft segment to cause a deformation. Another hypothesis was that the soft segment is elongated relative to a random coil due to its intrinsic molecular dissimilarity in polarization with the hard segment as well as additional stretching which occurs with hard segment phase separation. It was hypothesized that the application of the external electric field would release soft segment tie points to the hard segments and allow the soft segment to relax or contract to a random coil in the direction of the field. This was a plausible argument as the elongation of the soft segment was found by neutron scattering to be about 10% which is the order the macroscopic electrostrictive strain.

The art shows phase separated (heterogeneous) polyurethane system such as Dow 80AE PELLETHANE by the Dow Chemical Company. It is believed that phase separation between polar and nonpolar segments of the polyurethane chains is necessary for good electrostrictive properties.

Thermoplastic polyurethane elastomers can be used in transducers. Transducers perform energy conversions in one way by electrostrictive and piezoelectric fashion by using a ceramic or crystal, respectively, that establishes a voltage potential across one of its dimensions when one dimension of ceramic or crystal is changed in length due to compression or rarefaction. A voltage potential placed across the crystal or ceramic also causes a change in dimension.

Exemplars of the art are *A Combined Experimental and Analytical Approach to the Measurement of Electrostrictive Coefficients on Polymers Films@* by Guillot et al., *Science & Technology* by McGraw-Hill Book Company; U.S. Pat. No. 5,229,979 to Scheinbeim et al., issued on Jul. 20, 1993, U.S. Pat. No. 4,833,659 to Geil et al., issued on May 23, 1989, U.S. Pat. No. 4,712,037 to Verbeek et al., issued on Dec. 8, 1987, U.S. Pat. No. 4,707,294 to Mathew et al., issued on Nov. 17, 1987, U.S. Pat. No. 4,011,818 to Stosz Jr. et al., issued on Mar. 15, 1977, U.S. Pat. No. 5,166,573 to Brown, issued on Nov. 24, 1992, U.S. Pat. No. 4,576,882 to Davis et al., issued on Mar. 18, 1986, U.S. Pat. No. 4,654,279 to Bauer et al., issued on Mar. 31, 1987, U.S. Pat. No. 5,343,443 to Merewether, issued on Aug. 30, 1994, U.S. Pat. No. 4,795,935 to Fujii et al., issued on Jan. 3, 1989, U.S. Pat. No. 4,549,107 to Kaneko et al., issued on Oct. 22, 1985, U.S. Pat. No. 5,340,510 to Bowen, issued on Aug. 23, 1994; and U.S. Pat. No. 4,877,988 to McGinniss et al., issued on Oct. 31, 1989.

SUMMARY OF THE INVENTION

It is therefore an object to have a polymer with very high electrostriction properties for use in transducers.

It is another object to have a polymer with high electrostriction properties that can in be easily manufactured.

It is yet another object to have a polymer with high electrostriction properties that has a good impedance match to water.

To accommodate the above objects and other objects, there is provided a phase mixed thermoplastic polyurethane elastomer for use as an electrostrictive driver including an isocyanate, a butanediol, a polytetramethylene ether glycol, and a polyhydric alcohol.

The thermoplastic polyurethane elastomer being used for tranducers including underwater transducers, sonars and other electrostriction driven devices.

The thermoplastic polyurethane elastomer being made by adding a polytetramethylene ether glycol to isocyanate to form a mixture, then holding said mixture of the polytetramethylene ether glycol and isocyanate to a predetermined temperature for a predetermined time, degassing the mixture and sealing the mixture, measuring the percent free isocyanate to a predetermined molar ratio with the polytetramethylene ether glycol, chain extending said mixture into a first polymer with a butanediol and a polyhydric alcohol, adjusting the stoichiometry of the chain extender to a predetermined isocyanate index to avoid crosslinking, and postcuring the resin of the first polymer for a predetermined time and temperature.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 shows the hard segment diol chain extenders BDO and DMPD;

FIG. 3 includes graphs for relaxation times for phase mixed and phase separated systems;

FIG. 7 includes plots of the wide angle X-ray scattering of the phase mixed and phase separated systems;

FIGS. 8A through 8C are views of movabale mirrors;

DETAILED DESCRIPTION OF THE PREFERRED EMBODIMENTS

Figure 2:
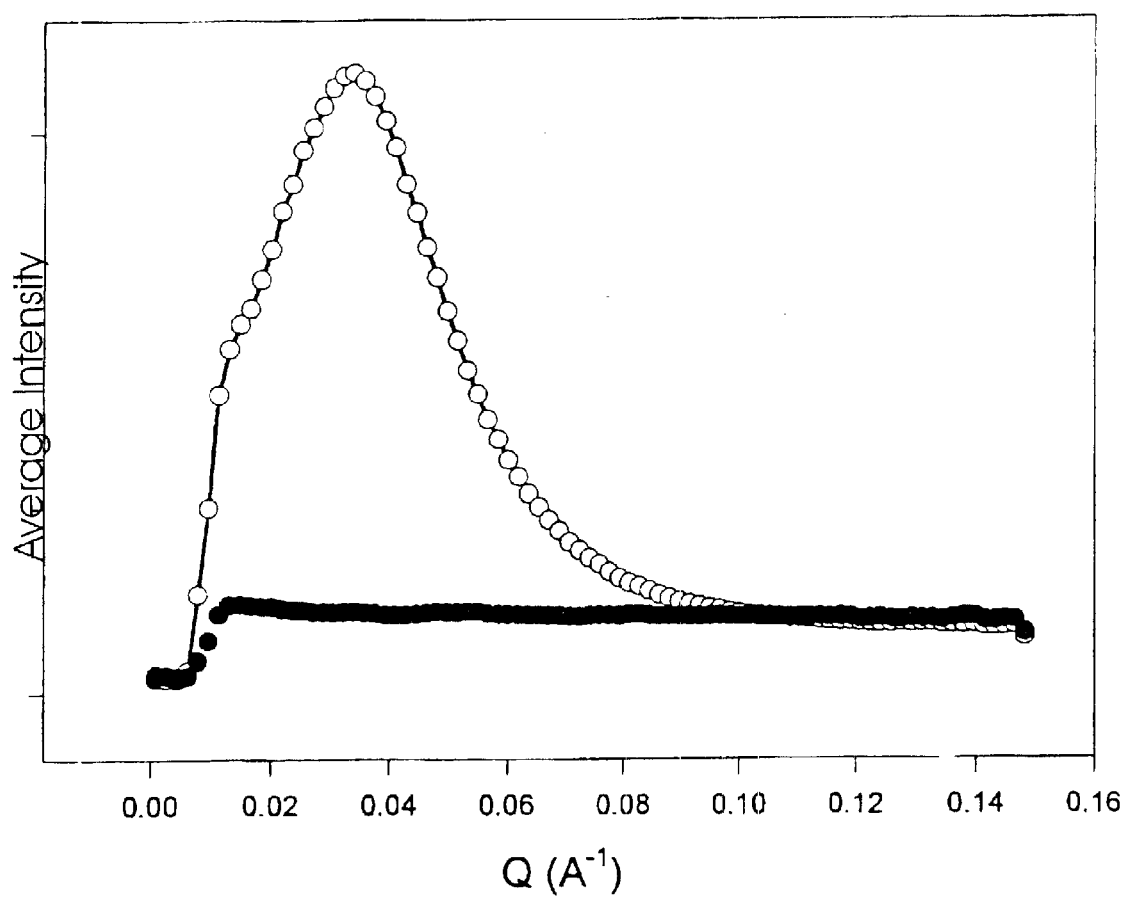
FIG. 2 is a chart of the small angle neutron scattering from phase mixed and phase separated systems.

In order to look at mechanism of polyurethane electrostriction, the response of polyurethanes of two extreme morphologies were compared with one heterogenous, the phase separated of the earlier art and the other homogenous, the phase mixed of the present invention described below. In contrast to the phase separated morphology typical of polyurethane there is also a phase mixed morphology for which there is no separation of the hard segment phase but a single homogeneous phase of the copolymer. This phase occurs by chemically altering the hard segment of the molecule such that it is compatible with the hydrocarbon segment and they solvate each other. From previous dynamic mechanical measurements the shear modulus of the phase mixed system is at least an order of magnitude lower than that of the phase separated system for frequencies of 100 Hz (Hertz) or lower. This implies that greater electrostrictive strains will occur for lower values of the applied field for the phase mixed system. This improved performance is exactly what is found for the coupling coefficient of the phase mixed system.

The composition of the commercial Dow 80AE is reported by KODAK to be 34% hard segment as determined by NMR (nuclear magnetic resonance). In order to synthesize this 0 polymer the required molar ratios are 10.78 MDI: 0.78 BDO: 1.00 PTMG of molecular weight 2000 for the phase separated system.

It was believed that phase separation between polar and nonpolar segments of the polyurethane chains was necessary for good electrostrictive properties. The present invention shows otherwise.

The electrostriction properties of the present invention shows unexpected results based on the art. In evaluating the electrostriction of two polyurethanes of different morphologies, one of the present invention and another from an earlier art. The morphology of the Dow 80 AE from the earlier art is that of two separated phases, one of hard regions embedded in the second of a soft elastic matrix. The formation of the two phases causes the soft segment elastomer to become stretched and therefore have the possibility to coil up and reduce its dimension upon application of electric field (electrostriction). In contrast to this is a polyurethane of a single homogenous phase (i.e. phase mixed) for which there is no prestraining of the polymer and a large electrostriction, for this mechanism, is therefore not expected. Both system can be evaluated by vibrometry. The measured electrostriction coefficient at 250 Hz (Hertz), for bilayers, for the phase separated system is 0.20 Angstrom/V (514 V/mil bias) and for the phase mixed system is 0.55 Angstrom/V (316 V/mil bias). The measurement Amil@ stands for $1/1000$ of an inch. Thus large electrostriction occurs for both phase mixed and phase separated morphologies. The larger value for the phase mixed system indicates that the prestrained soft segment is not the principal mechanism for electrostriction. The larger coefficient for the phase mixed system is in accord with its modulus being less than the phase separated system. These values are to be compared to the value of 6 Angstrom/V (460 V/mil bias) for the biaxial KODAK film as measured. The comparative difference in coupling constant value of the films of the present invention may be attributed to the noticeably higher molecular weight of the polymer in the KODAK film.

The following text discusses the mechanism of giant electrostriction in polyurethanes. When considering the molecular level for this class of materials, mechanisms of relaxations such as electrostriction can be formulated that are not accessible by continuum elasticity. One therefore has to compare and be ready to forgo results as predicted by continuum elasticity theory in favor of that of molecular level descriptions of polymer chain molecules. The simplest electrostrictive mechanism as predicted by the elasticity of a dielectric continuum occurs at its interface with air. The application of an electric field causes an alignment of the dipoles and results in a net polarization. The electric field in the dielectric is reduced by the polarization and is less than that external to the dielectric. This creates a net outward force on the surface layer of dipoles and a positive strain is developed. A composite model of individual dipoles in a continuum of a rubber elastic matrix was proposed by earlier based on a thermodynamic distribution of dipoles. Surprisingly, they find an electrostriction for which the strain in the direction of the electric field decreases with applied field. Although this does agree with experiment, they ponder the lack of agreement with the positive strain that is expected for a continuum polarization. It is not easy to rationalize why the direction of electrostrictive strain for discrete dipoles in a matrix would be opposite in direction from that in a continuous dielectric. An approach was made for which a positive strain occurs for the dipole ordering of the polar segments, and search for another mechanism which may explain the decrease of the net strain. To this end, the structure of both the polyurethane single molecule and its morphology in a thin film for insights into departures of its elastic response from that of a homogenous continuum is examined.

Polyurethane is a copolymer which in a single chain molecule containing two segments of vast differences: one is stiff and polar, the hard segment; the other is rubbery and nonpolar, the soft segment on the molecular level, the copolymer is expanded, compared to a homogeneous polymer, as the polar and nonpolar segments, being dissimilar, have a smaller probability of sharing a common volume on the larger microscopic level, when the polyurethane is pressed into a film, the hard segments, if long enough, are insoluble in the soft segment and a phase separation into domains of hard and soft segments occurs. The hard polar segments form islands of needle like platelets or lamellae. The elastic soft segments connecting these lamellae thus become elongated and stretched due to the phase separation. The lamellae are highly disordered and weakly packed as shown both by multiple thermal transitions that occur upon heating and the lack of strong scattering peaks as determined by x-ray diffraction. These weakly bound hard segments are therefore susceptible to deformation upon stress. When a large electric field is applied across a film of this morphology, a larger field occurs in the soft segment, of lower dielectric constant, than in the hard segment which then sees a net stress due to the difference in field resulting in electrostriction. This induces the hard segment to displace and allow the stretched soft segment to coil up. If the soft segments, due to the phase separation in a film, are on the average elongated by 10%, then by linear or affine theories of elasticity, the macroscopic strain through the sample is of the same order of magnitude. Upon application of the electric field, the coiling of the soft segment therefore can yield a macroscopic contraction of 10%

A single definitive experiment that would separate the effects of the pre-strained morphology of the phase separated system is to compare its electrostrictive response to that of an identical system of polar moments which is homogeneous (phase mixed) on a microscopic level. To obtain the phase mixed case, a moiety is chemically attached to the hard segment which makes it soluble in the soft segment and prevents phase separation. The mechanical properties of the phase mixed and separated systems are vastly different. As there is no formation of islands of hard segment lamellae for the phase mixed system, the shear modulus is lower by about ⅕ of that of the phase separated case. Thus electrostrictive measurements will distinguish whether a polar rubber of a lower modulus as in the phase mixed system or the particular morphology of the phase separated polyurethane is necessary for giant electrostriction.

The phase separated system of the earlier art was synthesized according to the composition determined by NMR for the commercial Dow 80AE PELLETHANE. The hard segment was of 34% 4,4-diphenylmethanediisocyanate (MDI) and 1,4-butanediol (BDO); the softer segment was poly (tetramethylene ether) glycol (PTMG) of molecular weight 2000. The phase mixed system of the present invention was of similar chemistry with the substitution that 2,2-dimethyl-1,3-propanediol (DMPD) for the BDO.

The composition of the commercial Dow 80AE is reported by KODAK to be 34% hard segment as determined by NMR. In order to synthesize this polymer the required molar ratios are 1.78 MDI: 0.78 BDO: 1.00 PTMG of molecular weight 2000 for the phase separated system. For the phase mixed system the same procedure was used but with mixtures by weight of BDO to DMPD of 0.15 to 0.85 respectively. The phase mixed system is prepared from a prepolymer of methylene diisocyanate (MDI) capped polytetramethyleneoxideglycol (PTMG) which is then reacted with dimethylpentanediol.

The details of the synthesis are shown in the following description. The prepolymers, PTMG 2000/MDI/BDO, are prepared from PTMG having nominal molecular weight of 2000 and MDI. In the phase mixed system, the molecular weight of PTMG can be between 900 to 2900. The diol (i.e. PTMG) is degassed, the seal of the vacuum vessel is broken and PTMG is poured into MDI and the mixture is held at 80° C. (Celsius) for 2 hours. The mixture is then degassed and sealed under a nitrogen blanket. Using ASTM (American Society for Testing and Materials) method D1638, the percent free isocyanate was measured. The prepolymer has a ratio of MDI/PTMG of 1.784:1 which is then chain extended with the mixture of BDO and DMPD. The chain extenders are shown in FIG. 1. The phase mixed polymer has the mixture of BDO and DMPD in the molar weight ratio of. 15 to 0.85. The molar ratios for the phase mixed system are:

1.78 MDI: 0.78(0.15 BDO+0.85 DMPD): 1.00 PTMG

The stoichiometry of the chain extender is adjusted so that the isocyanate index is 1.00, which yields a linear polymer with no crosslinking. Cross-linking is the attachment of two chains of polymer molecules by bridges composed of either an element, a group, or a compound which join certain carbon atoms of the chains by primary chemical bonds. The resins are postcured at 100° C. for 16 hours.

Alternative viable molar ratios for the phase mixed system includes varying the DMPD and the diisocyanate (MDI) as long as the stoichiometry is preserved. Adding a few percent up to 5% more diisocyanate to give a slight crosslinking can be added. Therefore, a little bit off stoichiometric addition of diisocyanate can be used.

In an alternative method of synthesis of the phase mixed system of the present invention includes mixing all the materials (1.78 MDI: 0.78(0.15 BDO+0.85 DMPD): 1.00 PTMG) at the same time. Heat all the materials to 40–50° C., then mix and degas until chain extender is dissolved. Meanwhile, melt the MDI at about 80° C. until clear. Degas at 40–60° C. Add stoichiometric amount to polyol mix and stir under a vacuum for approximately 2 minutes. Pour into a mold and then cure at approximately 70° C.

If the isocyanate index is greater than 1.00, then after degassing, 5 to 10 minutes, as viscosity is tow, the polymers are poured onto a polypropylene film held onto a draw down table. A doctor blade was used to draw the film which cured to thicknesses between 3 to 5 mils. The draw down process was carried out in a preheated oven at 70° C. and allowed to cure. If the film is a linear polymer where the isocyanate index is 1.00, it is dissolved in DMF solution and then the solution is filtered. Then the filtrate of a certain concentration (variable) is poured onto the polypropylene film. Pieces of the film were cut and placed between stainless steel mask held and held together with a magnetic composite. The sandwich was placed into a sputtering chamber and 250 Angstrom thick gold films were deposited. The electrode pattern was a circle 0.5 inch diameter. The films were electroded on both on one side and other pieces on both sides. These films were then stacked such that there were two layers with an internal electrode including a double sided and single sided electroded pieces and other two layer stacks with just outer electrodes having two single sided electroded pieces. The stacked layers were then placed between polypropylene films and then into a 70° C. oven between 2–12 lb (pounds) stainless steel platens for approximately 2 hours. This allowed the film layers to adhere to each other.

The large electrostrictive strains showed a viscoelastic time dependence that was indicative of molecular relaxations. The dynamics of these relaxations are responsible for both the magnitude of strain and its frequency response which are needed to optimize transducer performance. In order to investigate these molecular viscoelastic mechanisms of polyurethane electrostriction, a characterized series of polyurethanes with widely varying properties were synthesized. Typically polyurethanes are copolymers which at the molecular level consist of hard polar segments and a soft nonpolar segment. It is this difference of polarity that causes the polymer, when in bulk, to undergo a phase separation in which the hard segments form domains embedded in a matrix of the soft segment. This is known as a phase separated morphology and is typical of most polyurethanes. In contrast to this is a phase mixed morphology in which the hard segment mixes with the soft segment matrix resulting in a homogeneous morphology. These two morphologies are at the most extreme difference in organizational structure and their response to an applied field will present key information as to the mechanism of electrostriction.

Polyurethanes for both morphologies were synthesized in the form of a thin film (3 mils).

The characterization of these films by small angle neutron scattering is shown in FIG. 2 in which the scattered intensity is plotted vs Q, the scattering vector. The results for the phase separated samples show a well defined Bragg peak at 250 Å (Angstrom) which represents an averaged repeating structure of hard and soft regions. In contrast, the scattering from the phase mixed samples has a flat intensity indicative of a homogeneous phase.

Measurement of the mechanical modulus of these films correlated well with neutron scattering and showed that the modulus is dominated by the degree of phase separation. Further characterization of field dependence of both strain and corresponding dielectric changes as a function of time were made by a split electrode capacitance method. For this method, measurements under an applied field yielded, simultaneously, the change in thickness of the polymer film and the change in dielectric value due to the deformation. The change in dielectric value is due to the coupling of the polarization to the elastic field and corresponds to the electrostrictive correction to the Maxwell stress (the stress due to charged electrodes on a capacitor). The time dependencies of the polymer relaxations were measured isothermally at temperatures ranging from 10° C. to 60° C. as a function of bias field. The strains and dielectric changes showed incomplete relaxations at low electric fields which developed to saturation with increasing field and increasing temperatures. These results were fitted with a Debye relaxation function that yielded relaxation strengths for strain and dielectric values and their characteristic relaxation times. The most significant difference occurred in value and field dependence for the isothermal relaxation times for each morphology as shown in FIG. 3. The relaxation times for the phase separated system is highly sensitive to field and decreases with both increasing field and temperature. The corresponding relaxation times for the phase mixed system are much shorter and show little effect of field but significant temperature dependence. The relaxations are attributed to single bond rotations with little bond cooperativity as Arrhenius plots for the relaxation times yielded activation energies of about 2.8 kcal/mole typical of a single bond for both morphologies. We find two mechanisms are occurring during the relaxation. The first is a field induced motional change of dipole charge that is faster for the less hindered phase mixed morphology. The second is the formation of a space charge due to injection from the negative electrode and intrinsic ions which are trapped in the interfacial regions between the hard and soft segments where there is greater interfacial trapping regions between the hard and soft segments. The role of space charge is most noticeable in the temperature study of the strain response. For temperatures of ambient (20° C.) and below the strain appears mostly symmetrical with positive and negative values of field in accordance with a quadratic dependence for electrostriction. However, with increasing temperature, there is much lower strain values with saturation occurring at lower fields under positive bias than for those under negative bias which is indicative of space charge. Accordingly, it may be preferable to adopt a negative bias for optimum strain.

The phase mixed and phase separated morphologies of polyurethanes show distinguishable relaxations indicative of their morphological differences. The phase mixed morphology shows larger deformation and faster relaxation times that can improve the frequency response of polyurethane transducers.

The following discusses the electrostriction measurements in greater detail.

Figure 4:
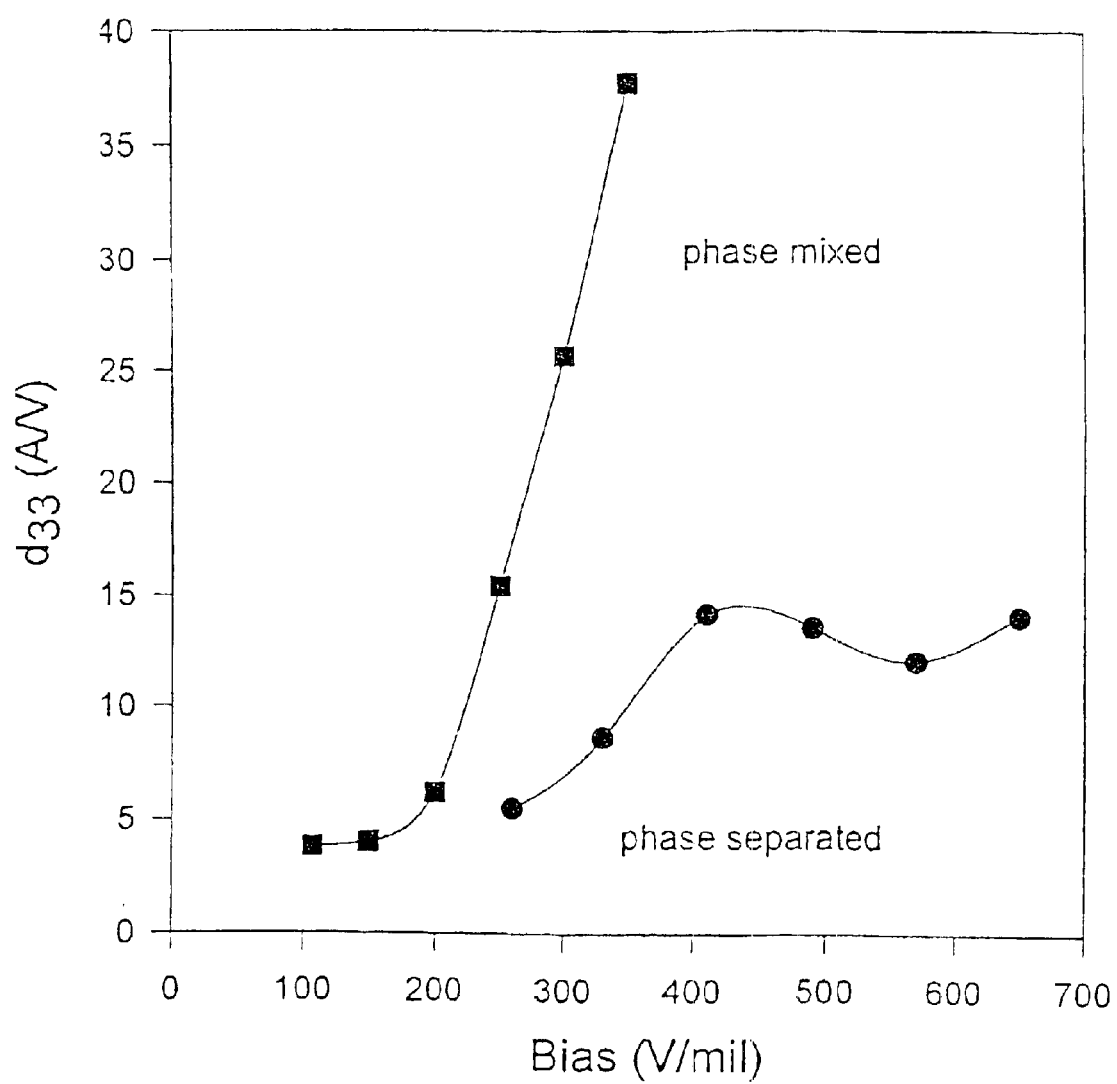
FIG. 4 is a graph of the electrostriction of the phase mixed and phase separated systems.

Samples of the stacked polyurethanes were dried in a dessicator and heated to 70° C. for 2 hours to remove moisture. Thin aluminum foil strips were mounted onto the electrode pads using a conducting paste. The samples were mounted into the sample holder shown in the FIG. 1 and placed under a slight tension to reduce extraneous flapping motions. A D.C. (Direct Current) bias voltage ranging from 100 up to 1000 volts was applied with a 250 Hz A.C. (Alternating Current) voltage of 70 V (volts) peak to peak. An electrical stress history of applying a bias electric field of approximately 800V/mil (Volts/thousandth of an inch) with the 250 Hz A.C. voltage was given to the sample before measurements in order to microfracture the gold electrodes. This enabled the constraining gold electrode to transition to a less constraining layer and allow large electrostrictive deformations to occur. The electrostrictive deformation of the electroded surface was measured by dual beam laser Doppler vibrometry. The electrostrictive coupling coefficient $d_{33}$ was obtained by dividing the ptp (peak to peak) voltage into the half the strain value. The $d_{33}$ values for the commercial urethane along those of the phase mixed phase polyurethane of the present invention are shown in FIG. 4. It is noted that the strains are governed by the boundary conditions of the sample holder. The mounting used in our experiment was designed to minimize large flapping motions that occur in a free standing film. With these considerations we find that phase mixed sample of the present invention has a coupling constant that is more than twice that of the commercial sample between 200 to 400 V/mil bias. Saturation of the effect was not noticed for the phase mixed sample as breakdown occurred. However it is noted that in this constrained state the coupling coefficient is approximately that reported for the free standing commercial film of 40 Angstroms/V. These greater coupling coefficients indicate powering advantages in the use of the phase mixed films.

A detailed description of the film preparations is shown below.

Both the PTMG1000/MDI/BDO and PTMG1000/DMPD/BDO (the PTMG has a molecular weight of 1000) polymers were melt polymerized which yielded solid portions of the polymer were diced and dissolved in THF (tetrahydrofuran) at 10% by weight for at least 72 hours at room temperature by slow magnetic stirring. The polymer dissolved easier in this method than when stirred by a more powerful COWLES mixer or some other type of mixer. The BDO hard segment containing polymer was cloudy, indicating phase separation while that of the DMPD was clear indicating homogeneity to at least 40 $\mu$m (micrometers). Both appeared clear in solution in contrast to the Dow 80AE which was cloudy in solution but clear after filtration. For the same 10% by weight solutions, the phase mixed system materials appeared less viscous than the DOW polymer PELLETHANE. As considerable gel slugs were present, the solutions were filtered in three stages: poured through 1) a coarse mesh of 1 mm, followed by 2) a mesh of 0.1 mm followed with 3) a 5 µm filter with 1 µm prefilter used in a MILLIPORE pressure filtration system or some other appropriate pressure filtration system. The prefilter and filter were changed hourly and for the 10% weight concentration 5 mls (milliliters) of filtrate were obtained in 8 hours; about 30 mls are needed for a film casting. The large content of gel slugs was attributed to the melt polymerization which at high temperatures increases the side reactions responsible for the slugs. Solution polymerization, generally performed at lower temperatures, can reduce the slug content. However to polymerize the DMPD hard segment requires a temperature of 100° C. which is in excess of the flash point of the THF solvent and is not safely feasible. The prepared solutions were then cast onto GE dielectric grade polypropylene in a class 100 clean room. A casting table (KODAK) to hold the propylene substrate and 20 mil drawdown blade were used to produce the film. The film was covered to prevent rapid evaporation of the THF which can cause pinholes and inhomogeneities. After drying the film thickness was approximately 1 mil (¹⁄₁₀₀₀ of an inch). By applying a second coat, films 2 mil thick were obtained and were preferred for their ease in handling. A bilaminate was formed by placing two films, one gold electroded (200 Angstrom), face to face between 12 lbs. (pounds) polished stainless steel plates in an oven heated to 115° C. Care was taken to keep the annealing time to 2 hours to prevent flow of the film. Gold electrodes with 1 "×1" area overlap were then sputtered on the two outer faces with an extra ⅛" lip for voltage attachments. An electrode 250 Å (Angstroms) thick was deposited by a sputtering procedure detailed in the previous quarterly report. In order to examine sample thickness dependencies of the vibrometer measurement, thicker bilaminates were made by annealing the 2 mil films together to form 4 mil films which were used for a set of thicker bilaminate samples. At the interfaces of the urethane layers there were pockets of trapped air. Hot rolling the samples squeezed out these pockets, however the metal electrodes became deformed.

Figure 5:
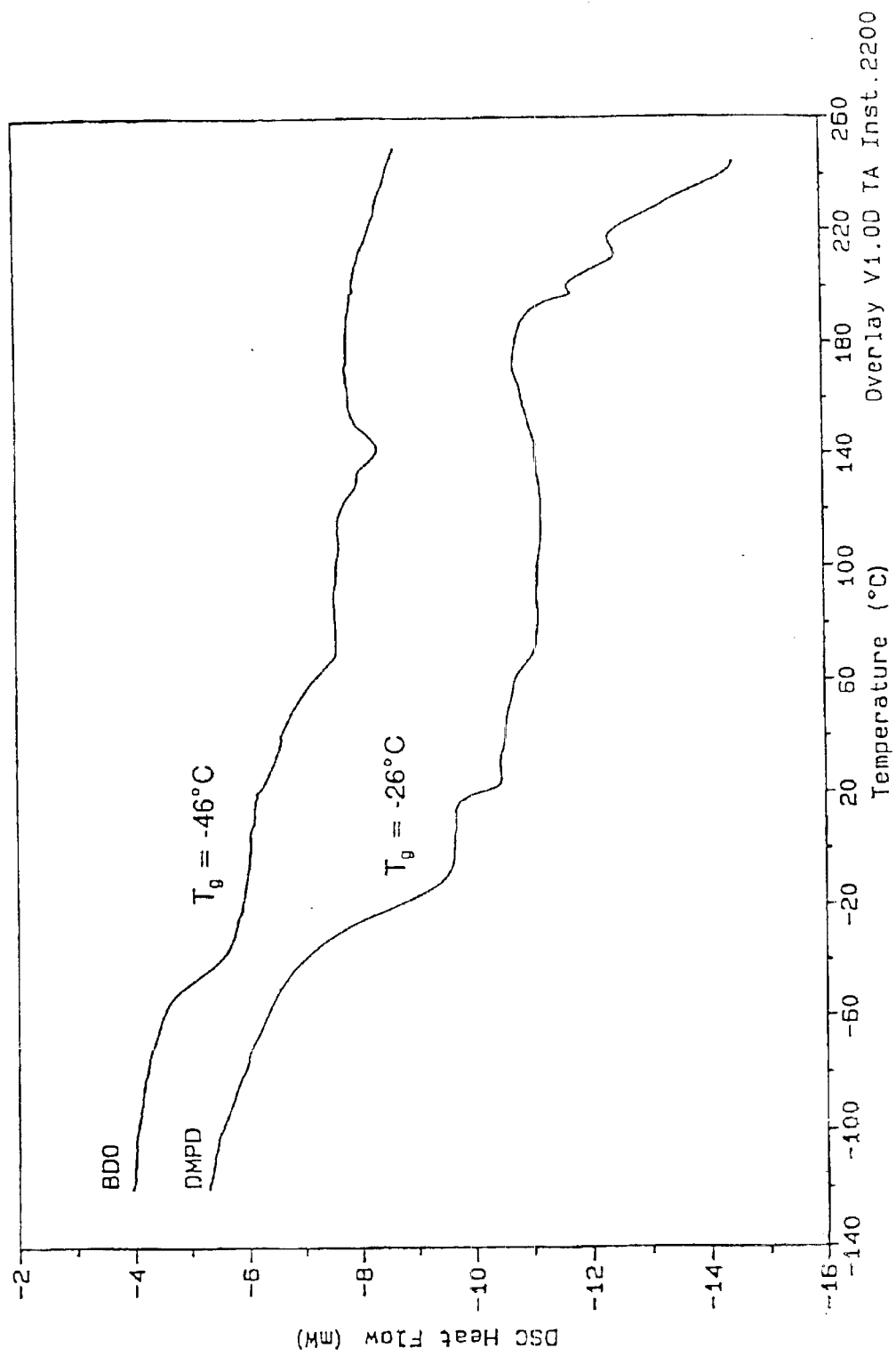
FIG. 5 is a plot of thermal calorimetry.

Referring to FIG. 5, in the thermal calorimetric method, the sample is heated at a fixed rate and the heat absorbed at the particular temperature is recorded. Thus the specific heat, large molecular motions as the glass transition, and crystalline melting can be determined. The variation of the glass transition is a good measure of phase separation as will be explained below. As polymerized samples weighing approximately 2 mg (milligrams) were placed in a DUPONT differential-scanning calorimeter (DSC) or some other calorimeter; scans were made at 10 deg/min in order to compare with previous reported data of DOW 80AE. These scans appear in FIG. 2. The glass transitions (To for the polymers occur at –26° C. for the phase mixed DMPD and at –46° C. for the phase separated BDO containing hard segment. The phase separated system $T_g$ is in good agreement to the value of –45° C. found for the Dow 80AE polymer, as is expected. The difference in $T_g$ of 20° C. between the BDO and DMPD hard segment is the effect of phase separation. When regions of the soft segment are separate from that of the hard segment, the soft segment molecular chains have ease of bond rotations which why they are known as soft segments. As hard segments mix into and become neighbors of the soft segments they hinder the ease of molecular bond rotation; thus a higher glass transition temperature is necessary for molecular motion to occur in the phase mixed sample, which is what we find. As the frequency response of the modulus follows the glass transition, it would be interesting to see how the electrostrictive frequency response differs for these samples of large difference in glass transition.

Figure 6:
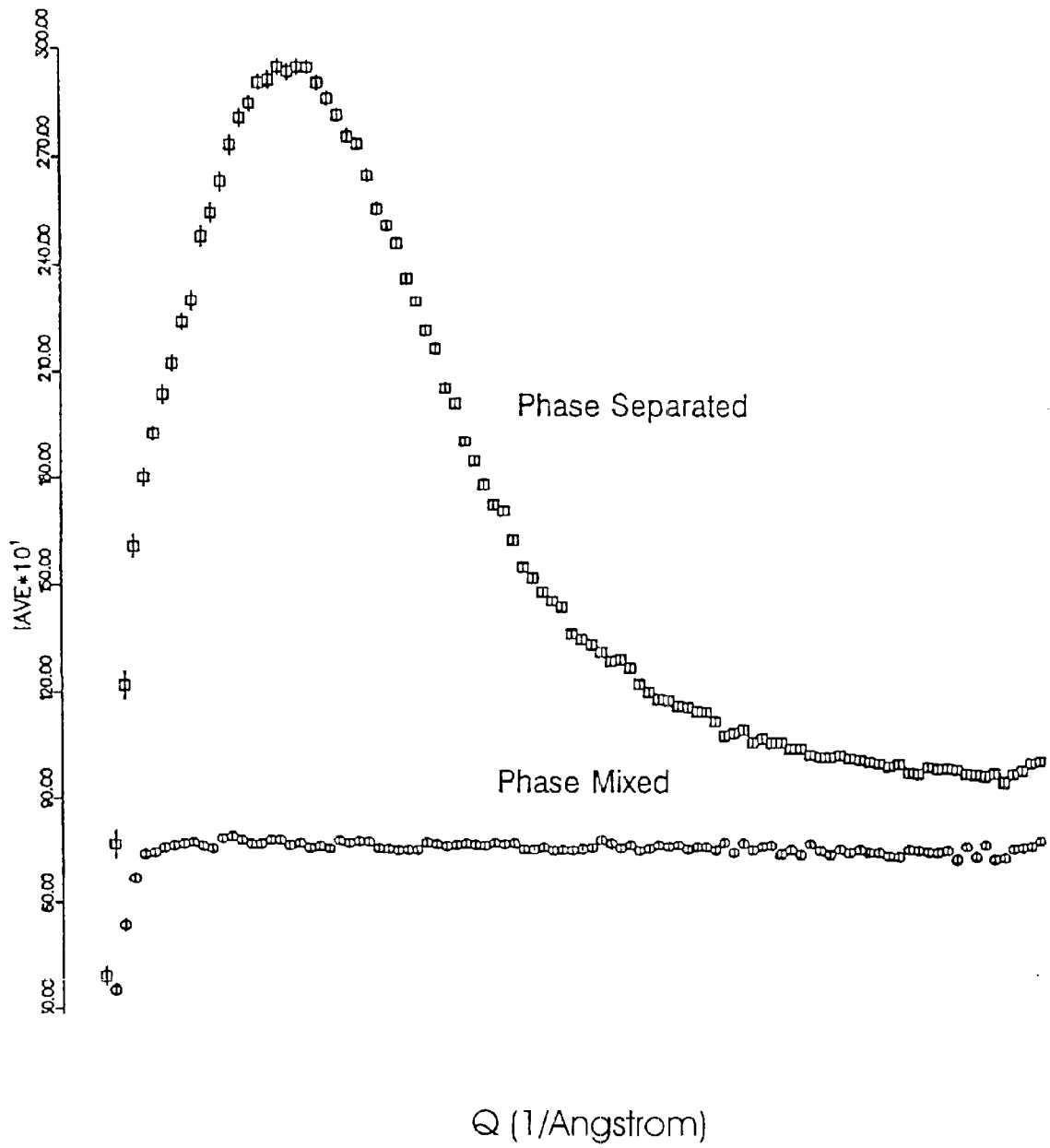
FIG. 6 is another plot of the small angle neutron scattering of the phase separated and phase mixed systems.

The phase separation of the two systems (one being phase mixed and the phase separated) formulations was also detected using small angle neutron scattering (SANS). Samples 1 mm (millimeter) thick of the as-polymerized stock were placed in the neutron beam line at NIST. The resulting intensity in FIG. 6 for the polymer with the BDO containing hard segment shows a scattering peak indicating a heterogeneous or phase separated system; that of the DMPD hard segment is flat in intensity over the same wave number region. By using the Bragg Law for the peak, the average distance between the total of the hard segments and the soft segment domain may be found for the phase separated films.

As the hard segment domain is expected to affect the physical properties of electrostriction, wide angle x-ray diffraction patterns were taken for the phase separated systems. The resulting diffraction patterns shown in FIG. 7, taken between 10 to 30 degrees for both preparations, show single broad peaks and no sharp crystalline bands.

A greater deformation is achieved at lower power (lower voltage). When a voltage (V) is applied across the material of the present invention, some current (I) is carried through the material causing voltage loss in the form of an IR drop. The effective voltage(capacitative) Vc is V−IR or Vc=V−IR. The amount of deformation in the material will be proportional to Vc. If we can reduce the current (I) carried by the material, we increase Vc.

$$\log I = T - t_g$$

where

I=the current carried through the material

T=the operating temperature (usually room temperature)

$t_g$=the glass transition temperature of the polyurethane material.

By increasing the glass transition temperature (td of the material of the present invention we increase the electrical resistance of the material, lowering the current carried through the material, lowering the IR drop loss, thus reducing the voltage (V) that must be applied to get the material to deform. The amount of deformation is proportional to the effective voltage (Vc) but also the softness of the material. As the glass transition temperature (td is raised toward the operating (room) temperature, the softness is decreased and the amount of deformation is decreased. Thus, the selection of a $t_g$ is a matter of balancing the applied voltage versus the amount of deformation needed. So far, the high voltage needed is the problem, not the amount of deformation. Thus raising the $t_g$ still further appears to be the technique needed.

The high voltages that currently are used require expensive, complicated circuits. The goal is to reduce the voltage (V) needed to a point where conventional, inexpensive power sources can be used.

The soft polyurethane transducer materials of this invention have good impedance matching with liquids such as sea water or blood and thus the transducers can have simple designs as compared to the hard terfenol magnetostrictive transducers.

Figure 8A:
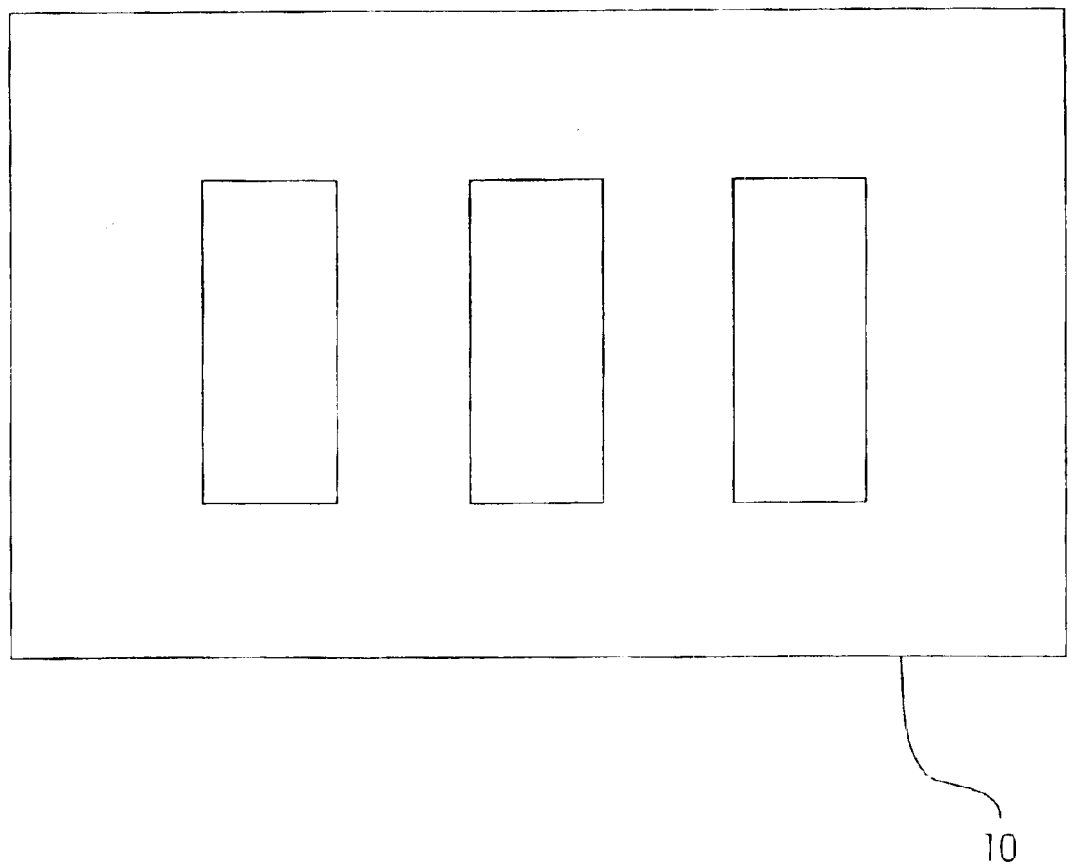
Figure 8B:
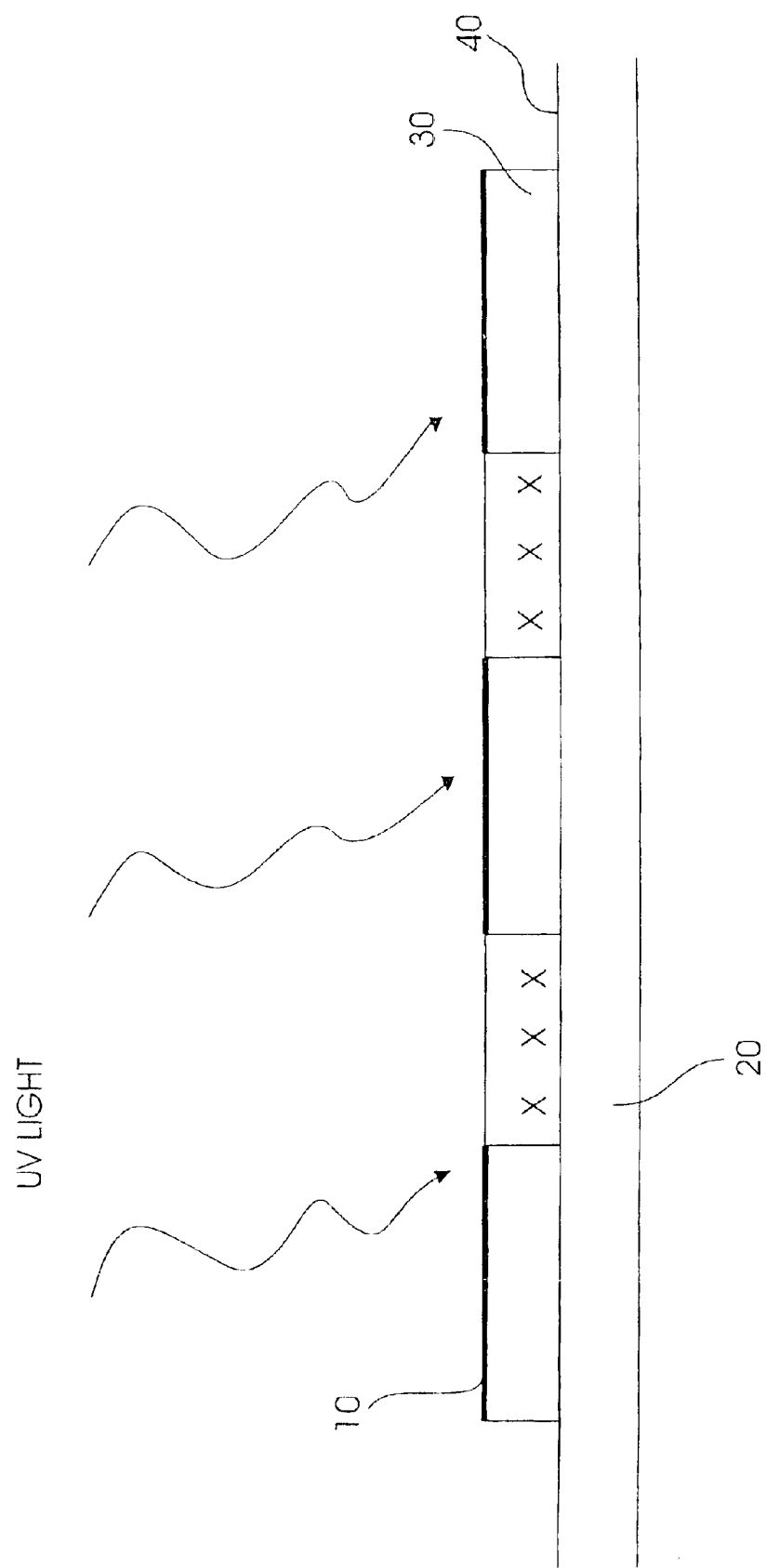

Referring to FIGS. 8A through 8C, an example of a use for the phase mixed system of the present invention is a movable mirror used in signal processing for optics. The polyurethanes of the phase mixed system of the present invention will be prepared with side groups of double bonds of carbon (i.e., —C═C═C). This is needed to ultraviolet crosslink polymer as similar to a photoresist. After curing, another gold layer 50 is deposited with a mask 10 on the polymer and uncrosslinked polymer is washed with solvent.

As seen in FIG. 8C, these are now 3 pixels which can be addressed individually to distort and reflect light (microstructures). FIG. 8A shows the mask 10 with the photocrosslinkable polyurethane 30 on top of a substrate of rubber 20 with a gold layer 40 in between.

Figure 9:
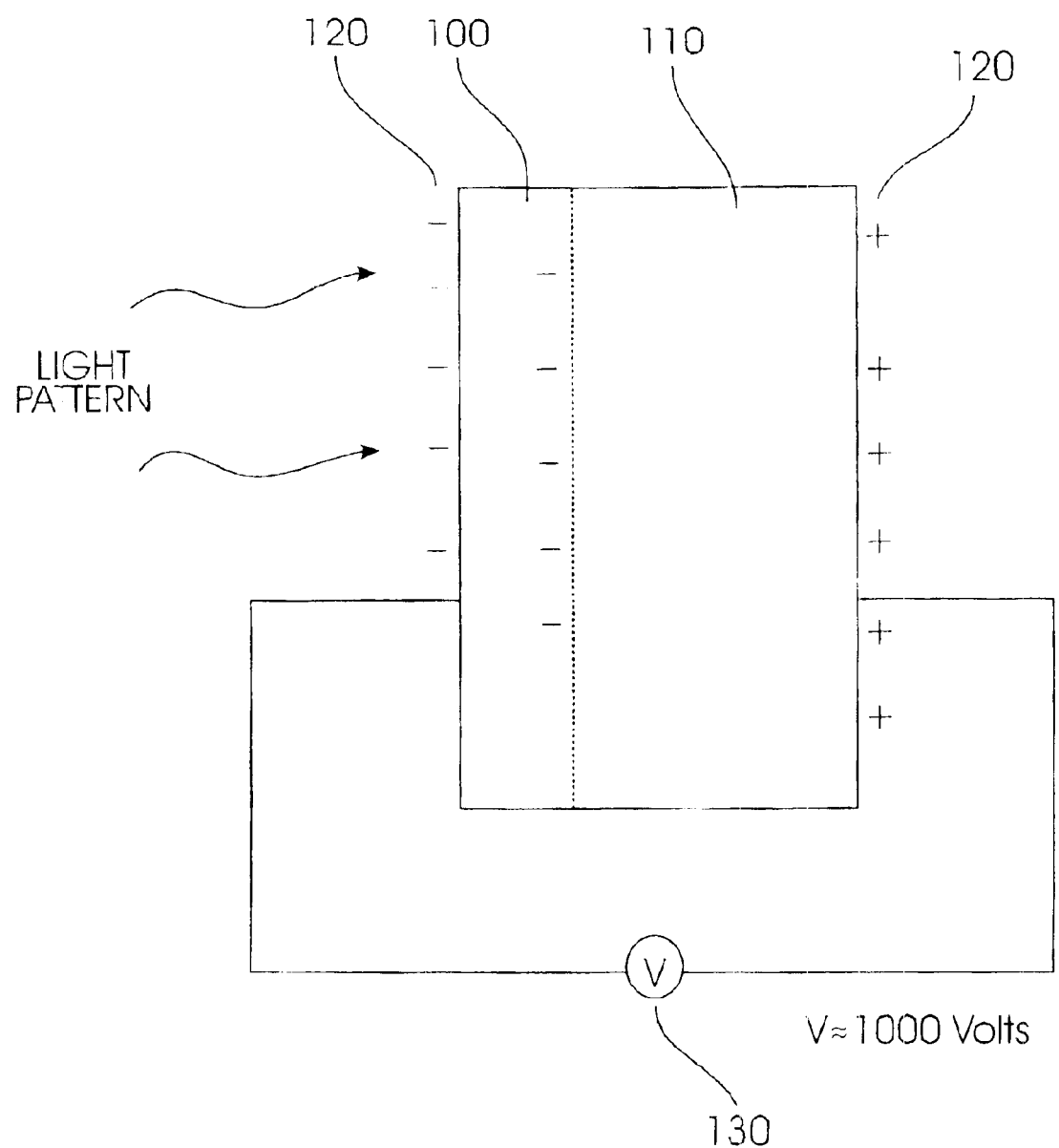
FIG. 9 is a view of an adaptive beam former.

Another example for a use of the polymer of the present invention is shown in FIG. 9 which shows a device for producing images for an adaptive acoustic driver.

The device is a two layer sandwich including a thin 3 mm (millimeters) thick layer 110 of electrostrictive polyurethane of the mixed phase system coated with a mil of polymer photoconductor 100 of similar elastic modulus. The bilayers are then electroded 120 with 250 Angstroms of gold which act as "broken" electrodes. A voltage 130 of about a thousand volts is then applied, either harmonically at a biased potential for an acoustic driver or statically for an imaging device. A fiber optic array transmits an illumination pattern to the photoconductor side of the electrically biased sandwich; the excited charges in this layer are transported through it to the polyurethane boundary. This creates a greater electric field across the polyurethane elastomer and causes it to deform electrostrictively. This deformation which replicates the light image can be read out optically or interfaced with a fluid for creating an acoustic pulse which can be adaptively formed.

The mixed phase system of the present invention allows for large deformations up to 15% strain which is the largest known for an electrostrictive material.

The topic of reproducing an optical image on an elastomeric surface have also been known as ruticon devices.

As this material undergoes large strains it can be used as an actuator switch to couple to high voltages as well as for other devices requiring large displacements.

Figure 10:
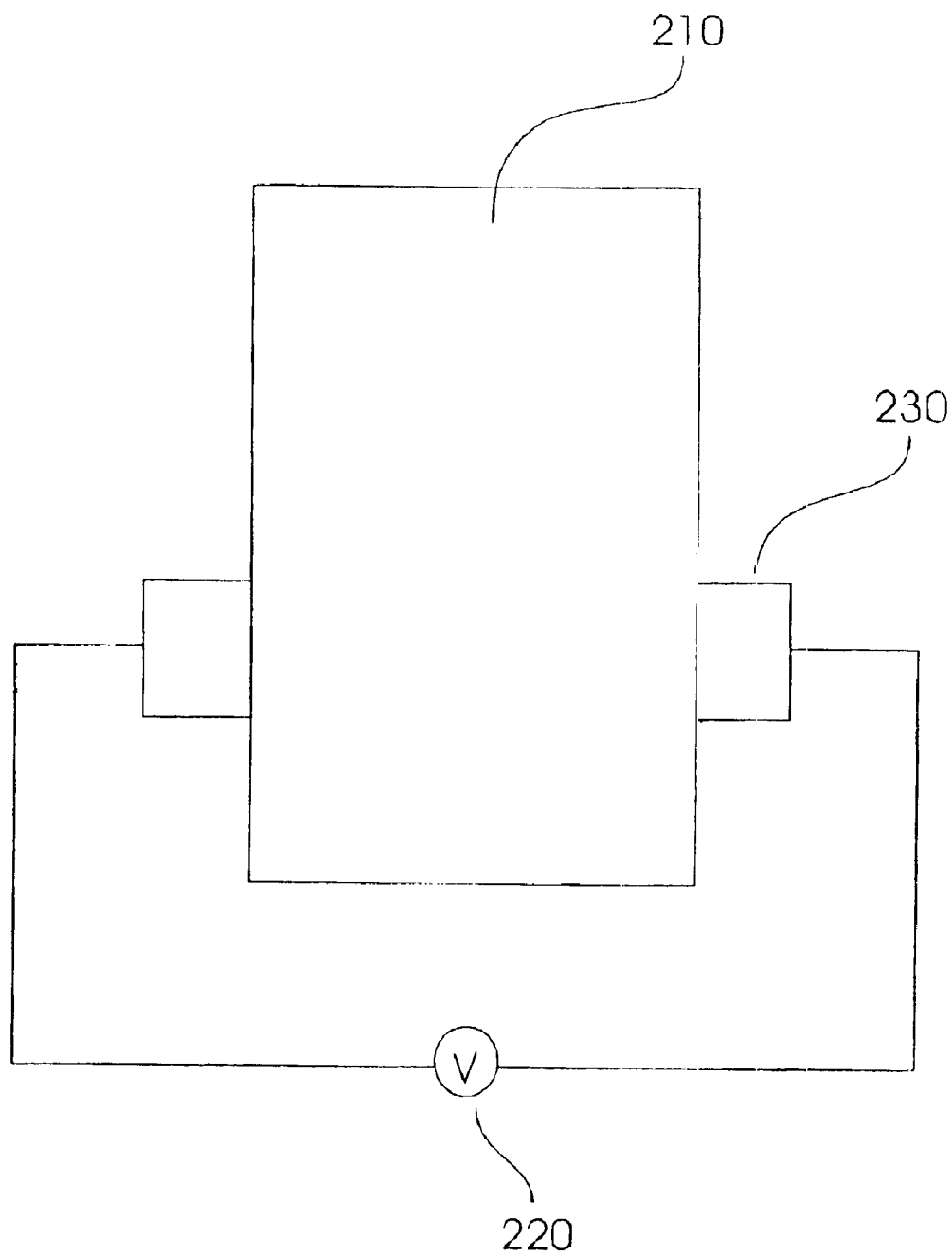
FIG. 10 is a view of a transducer.

Referring to FIG. 10, shows another use of mixed phase system of the present invention in a transducer 200. The transducer includes a first unit 210 including layers of the phase mixed (homogeneous) system of the thermoplastic polyurethane elastomer of the present invention. A layer of polyurethane of the present invention is electroded through with electrodes 230. Electrodes 230 of two hundred and fifty Angstrom (250 Å) gold layer on the layers of the phase mixed polyurethane of the first unit 210 connect to a power or signal source 220.

The phase mixed polymer of the present invention can be used in transducers for ships and sonabuoys. The phase mixed polymer of the present invention has a better impedance matching with sea water because for instance the softness as compared to the phase separated system of the earlier art.

The soft polyurethane transducer materials of this invention have good impedance matching with liquids such as sea water or blood and thus the transducers can have simple designs.

EXAMPLE 1

The polymer of a phase mixed system includes the materials 4,4-diphenylmethanediisocyanate (MDI); 1,4-butanediol (BDO); 2,2-dimethyl-1,3-propanediol (DMPD); and poly(tetramethylene ether) glycol (PTMG) of molecular weight 2000.

The phase mixed system is prepared from a prepolymer of methylene diisocyanate (MDI) capped polytetramethyleneoxideglycol (PTMG) which is then reacted with dimethylpentanediol. The prepolymers, PTMG 2000/MDI/BDO, are prepared from PTMG having nominal molecular weight of 2000 and MDI. The diol (i.e. PTMG) was added to MDI and the mixture was held at 80° C. (Celsius) for 2 hours. The mixture is then degassed and sealed under a nitrogen blanket. Using ASTM (American Society for Testing and Materials) method D1638, the percent free isocyanate was measured. The prepolymer has a ratio of MDI/PTMG of 1.784:1 which is then chain extended with the mixture of BDO and DMPD. The phase mixed polymer has the mixture of BDO and DMPD in the weight ratio of 0.15 to 0.85. The molar ratios for the phase mixed system are:

1.78 MDI: 0.78(0.15 BDO+0.85 DMPD): 1.00 PTMG

The stoichiometry of the chain extender is adjusted so that the isocyanate index is 1.00, which yields a linear polymer with no crosslinking. Cross-linking is the attachment of two chains of polymer molecules by bridges composed of either an element, a group, or a compound which join certain carbon atoms of the chains by primary chemical bonds. The resins are postcured at 100° C. for 16 hours.

EXAMPLE 2

Alternative viable molar ratios for the phase mixed system of example 1 includes varying the DMPD and the diisocynate (MDI) as long as the stoichiometry is preserved. Adding a few percent up to 5% more diisocynate to give a slight crosslinking can be added. Therefore, a little bit off stoichiometric addition of diisocynate can be used.

EXAMPLE 3

In an alternative method of synthesis of the phase mixed system of example 1 includes mixing all the materials (1.78 MDI: 0.78(0.15 BDO+0.85 DMPD): 1.00 PTMG) at the same time. Heat all the materials to 40–50° C., then mix and degas until chain extender is dissolved. Meanwhile, melt the MDI at about 80° C. until clear. Degas at 40–60° C. Add stoichiometric amount to polyol mix and stir under a vacuum for approximately 2 minutes. Pour into a mold and then cure at approximately 70° C.

EXAMPLE 4

The polymer of a phase mixed system includes the materials 4,4'diphenylmethanediisocyanate (MDI); 1,4-butanediol (BDO); 2,2-dimethyl-1,3-propanediol (DMPD); and poly(tetramethylene ether) glycol (PTMG) of molecular weight 1000.

The phase mixed system is prepared from a prepolymer of methylene diisocyanate (MDI) capped polytetramethyleneoxideglycol (PTMG) which is then reacted with dimethylpentanediol. The prepolymers, PTMG 1000/MDI/BDO, are prepared from PTMG having nominal molecular weight of 1000 and MDI. The diol (i.e. PTMG) was added to MDT and the mixture was held at 80° C. (Celsius) for 2 hours. The mixture is then degassed and sealed under a nitrogen blanket. Using ASTM (American Society for Testing and Materials) method D1638, the percent free isocyanate was measured. The prepolymer has a ratio of MDI/PTMG of 1.784:1 which is then chain extended with the mixture of BDO and DMPD. The phase mixed polymer has the mixture of BDO and DMPD in the weight ratio of 0.15 to 0.85. The molar ratios for the phase mixed system are:

1.78 MDI: 0.78(0.15 BDO+0.85 DMPD): 1.00 PTMG

The stoichiometry of the chain extender is adjusted so that the isocyanate index is 1.00, which yields a linear polymer with no crosslinking. Cross-linking is the attachment of two chains of polymer molecules by bridges composed of either an element, a group, or a compound which join certain carbon atoms of the chains by primary chemical bonds. The resins are postcured at 100° C. for 16 hours.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A transducer, comprising:
   a layer of electrostrictive polyurethane consisting essentially of:
   4,4-diphenylmethane diisocyanate;
   1,4-butanediol;
   2,2-dimethyl-1,3-propanediol; and
   polytetramethylene ether glycol, and
   an electrode being coupled to said layer of electrostrictive polyurethane, said electrode receiving a signal for driving said electrostrictive polyurethane.

2. The transducer of claim 1, wherein said electrode is 250 Angstroms thick.

3. The transducer of claim 2, wherein said electrode comprising gold.

4. The transducer of claim 3, wherein said polytetramethylene ether glycol is of a molecular weight of and including 900 to and including 2900.

* * * * *